(12) United States Patent
Fiat et al.

(10) Patent No.: US 6,313,631 B1
(45) Date of Patent: *Nov. 6, 2001

(54) DOUBLE-RESONANCE MRI COIL

(75) Inventors: Daniel Fiat, Oak Park, IL (US); Janez Dolinsek, Ljubljana (SI)

(73) Assignee: The Board of Trustees of the University of Illinois, Urbana, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/811,346

(22) Filed: Mar. 4, 1997

Related U.S. Application Data

(63) Continuation of application No. 08/623,667, filed on Mar. 28, 1996, now Pat. No. 5,675,254, which is a continuation of application No. 08/501,888, filed on Jul. 13, 1995, which is a continuation of application No. 08/105,419, filed on Aug. 12, 1993, which is a continuation-in-part of application No. 08/071,582, filed on Jun. 2, 1993, now Pat. No. 5,433,196.

(51) Int. Cl.$^7$ ..................................................... G01V 3/00
(52) U.S. Cl. ........................... 324/318; 324/307; 600/421
(58) Field of Search ................................. 324/318, 322, 324/314, 300, 307, 309; 600/421

(56) References Cited

U.S. PATENT DOCUMENTS

| | | | |
|---|---|---|---|
| 5,221,901 | * 6/1993 | Decke et al. | 324/322 |
| 5,229,724 | * 7/1993 | Zeiger | 324/322 |
| 5,365,173 | * 11/1994 | Zou et al. | 324/322 |
| 5,675,254 | * 10/1997 | Fiat et al. | 324/318 |

OTHER PUBLICATIONS

Fukushima, E., et al., *Experimented Pulse NMR: A Nuts and Bolts Approach*, 95–105 (Reading, MA: Addison–Wesley Publishing Co., Inc. 1981).

Meiroom, S., *Nuclear Magnetic Resonance Study of the Proton Transfer in Water*, II–3 Journal of Chemical Physics 373–388 (Jan., 1961).

Noggle, J., et al., *The Nuclear Overhauser Effect*, 102–112 (New York: Academic Press, 1971).

Pike, G., et al., *Pulsed Magnetization Transfer Spin–Echo MR Imaging*, 3–3 JMRI 531–539 (May/Jun., 1993).

Pople, J.A., et al., *High–resolution Nuclear Magnetic Resonance* (New York: McGraw–Hill Book CO., Inc., 1959).

Schneider, E., et al., *Pulsed Magnetization Transfer versus Continuous Wave Irradiation for Tissue Contrast Enhancment*, 3–2 JMRI 417–423 (Mar./Apr. 1993).

Schlichter, C.P., Principles of Magnetic Resonance Ch. 7 (Berlin: Springer–Verlag [no date]).

* cited by examiner

*Primary Examiner*—Louis Arana
(74) *Attorney, Agent, or Firm*—Welsh & Katz, Ltd.

(57) ABSTRACT

A double-resonance coil for use in MRI having a coil element, a first input/output terminal coupled to the coil element, and a second input/output terminal coupled to the coil element. A first resonance means is coupled between the coil element and the first input/output terminal to cause the MRI coil to resonate at a first MRI frequency, and a second resonance means is coupled between the coil element and the second input/output terminal to cause the MRI coil to resonate at a second MRI frequency substantially different than the first MRI frequency. The double resonance coil includes a first frequency-blocking means coupled to the coil element for substantially preventing the second MRI frequency from being detected at the first input/output terminal and a second frequency-blocking means coupled to the coil element for substantially preventing the first MRI frequency from being detected at the second input/output terminal.

20 Claims, 3 Drawing Sheets

DOUBLE-RESONANCE MRI COIL

This is a continuation of Ser. No. 08/623,667 filed Mar. 28, 1996 is now U.S. Pat. No. 5,675,254; which is a continuation of Ser. No. 08/501,888 filed Jul. 13, 1995; which is a continuation of Ser. No. 08/105,419 filed Aug. 12, 1993; which is a continuation-in-part of U.S. Ser. No. 08/071,582 (now U.S. Pat. No. 5,433,196), entitled "Oxygen-17 MRI Spectroscopy and Imaging in the Human," filed Jun. 2, 1993.

BACKGROUND OF THE INVENTION

The present invention relates to a double-resonance coil for use in NMR spectroscopy and imaging which allows simultaneous radiation and detection at two different radio frequencies.

Nuclear magnetic resonance (NMR) spectroscopy and magnetic resonance imaging (MRI) are used in various medical applications. For example, conventional MRI systems in widespread use generate an anatomical image of a selected portion of the human body by utilizing a radio-frequency (RF) coil to irradiate the selected body portion with radiation at a frequency of 63.9 MHz, which causes nuclear magnetic resonance of hydrogen-1 constituents (protons) in the selected body portion at 1.5 Tesla. The image is then generated based on changes in the nuclear signal sensed via the RF coil.

It has been suggested that dual-frequency NMR imaging, which would generate and detect RF energy at two frequencies, could be utilized via a double-resonance MRI coil. For example, in an abstract entitled Oxygen-17: A Physiological, Biochemical and Anatomical MRI Contrast Agent from the Seventh Annual Meeting of the Society of Magnetic Resonance in Medicine, Mateescu, et al. state: "A $^{17}O/^{1}H$ double resonance probe was used in experiments in which reliable superposition of oxygen and proton images was sought."

In U.S. Pat. No. 4,742,304, Schnall, et al. disclose a multiple-tuned NMR probe which can radiate RF energy and detect changes in the RF energy at a number of different frequencies. While the patent states that the NMR probe allows "simultaneous study of different nuclei" (col. 1, lines 7–8), it is apparent that the NMR probe is excited with the different NMR frequencies consecutively, not simultaneously. The Schnall, et al. probe's inability to be used in simultaneous NMR spectroscopy and/or imaging is apparent from the fact it only has one input/output terminal: "It is another object of the present invention to provide such a multiple-tuning NMR probe in which all frequencies are generated and detected using a single input/output terminal." Column 2, lines 26–29.

SUMMARY OF THE INVENTION

The present invention is directed to a double-resonance coil for use in MRI. The double-resonance coil includes a coil element, a first input/output terminal coupled to the coil element, and a second input/output terminal coupled to the coil element. A first resonance means is coupled between the coil element and the first input/output terminal to cause the double-resonance coil to resonate at a first MRI frequency, and a second resonance means is coupled between the coil element and the second input/output terminal to cause the double-resonance coil to resonate at a second MRI frequency different than the first MRI frequency. The double-resonance coil includes a first frequency-blocking means coupled to the coil element for substantially preventing the second MRI frequency from being detected at the first input/output terminal and a second frequency-blocking means coupled to the coil element for substantially preventing the first MRI frequency from being detected at the second input/output terminal.

The double-resonance coil in accordance with the present invention would allow, for example, simultaneous excitation of oxygen-17 and hydrogen-1 isotopes present in a portion of a human patient in order to provide accurate superposition of anatomical images produced by hydrogen-1 resonance with images relating to blood flow or oxygen consumption produced by oxygen-17 resonance. Alternatively, the double-resonance coil could be used to provide simultaneous excitation of xenon-129 and hydrogen-1 constituents in order to, for example, provide accurate superposition of anatomical images produced by hydrogen-1 resonance with images relating to blood flow produced by xenon-129 resonance. The double-resonance coil could also be used to provide simultaneous excitation of xenon-129 and oxygen-17 constituents in order to, for example, provide accurate superposition of images produced by xenon-129 resonance with images produced by oxygen-17 resonance.

The features and advantages of the present invention will be apparent to those of ordinary skill in the art in view of the detailed description of the preferred embodiment, which is made with reference to the drawings, a brief description of which is provided below.

DETAILED DESCRIPTION OF THE PREFERRED EMBODIMENT

The contents of the parent U.S. Pat. No. 5,433,196 are hereby incorporated by reference.

Figure 1:
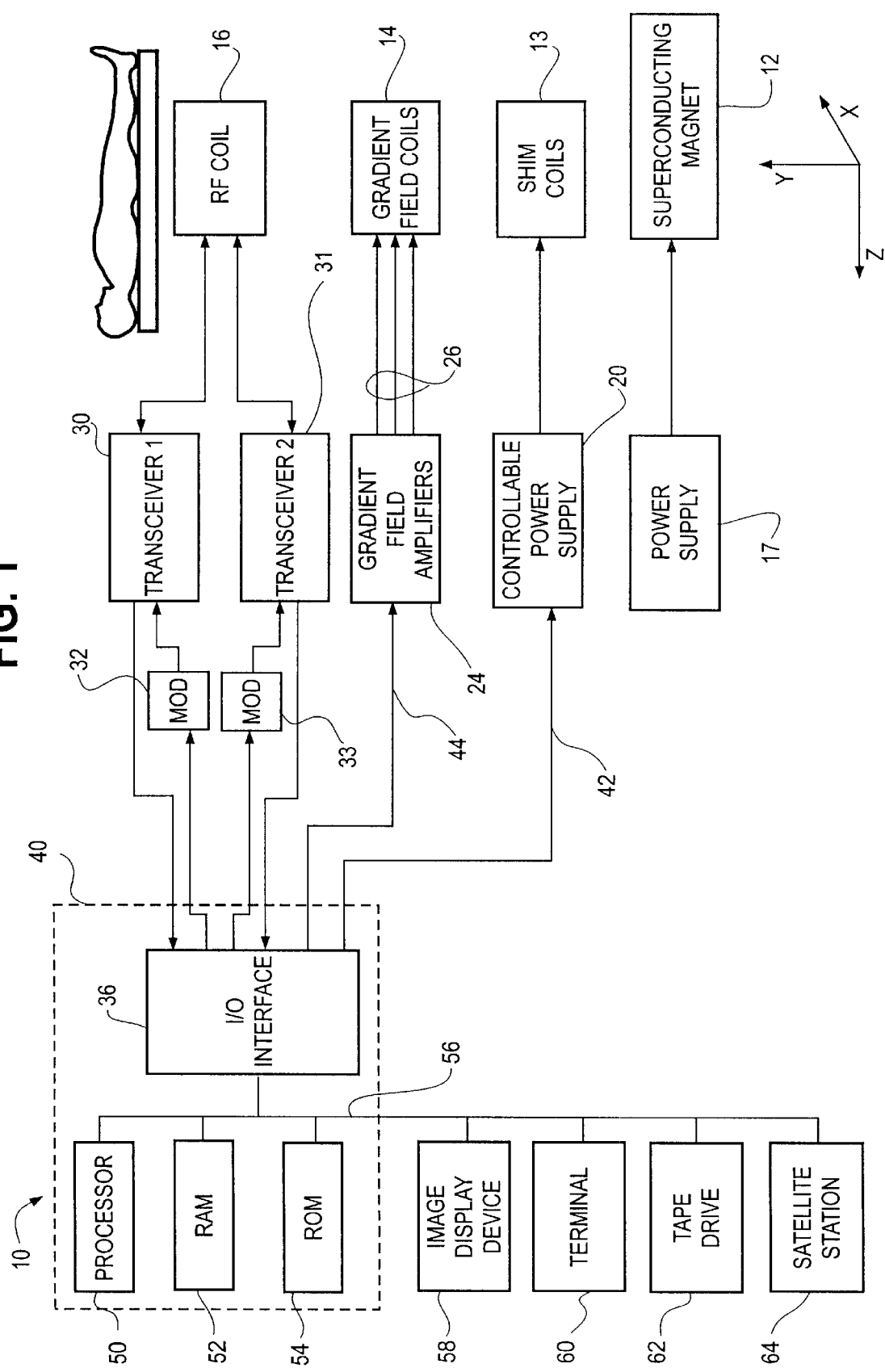
FIG. 1 illustrates an MRI system for use in connection with humans.

FIG. 1 illustrates a magnetic resonance imaging (MRI) system 10 imaging system 10 which operates by magnetically resonating NMR constituents or isotopes such as hydrogen-1 or oxygen-17 in a portion of a human patient. The MRI system 10 includes a plurality of elements for generating various magnetic fields to produce magnetic resonance of the MRI constituents. These elements include a whole body, superconducting magnet 12 for generating a uniform, static magnetic field. The magnet 12 is referred to as a "whole body" magnet since its circumference is large enough to accommodate the entire body of a person. The uniform static magnetic field is generated in the z-direction as shown in FIG. 1. Like most standard MRI systems currently in operation in the United States, the superconducting magnet 12 generates a static magnetic field having a magnitude of 1.5 Tesla. While the magnet 12 is illustrated as a box 12 below the patient, it should be understood that the magnet 12 is generally cylindrical in shape and surrounds the patient. As is conventional, a number of shim coils 13 provide additional static fields to supplement the main static field generated by the magnet 12.

The MRI system 10 includes a number of whole body, gradient field coils 14 which generate magnetic field gradients in the x, y, z directions in a conventional manner to facilitate MRI. In conventional 1.5 Tesla NMR systems, the magnetic field gradients are typically between about 0.5–1.0 gauss/centimeter. The gradient field coils 14 surround the patient.

The MRI system 10 also includes an RF coil 16 for generating a resonant electromagnetic field at two radio frequencies for causing magnetic resonance of two different MRI constituents in the patient. The resonant electromagnetic field may be generated in any direction perpendicular to the static field. For example, if the static magnetic field is generated in the z-direction, the resonant field may be generated in any direction in the x-y plane. The RF coil 16 also receives electrical MRI signals caused by the magnetic resonance of the NMR constituents. While the RF coil 16 is shown schematically as a box 16 below the patient, it should be understood that the RF coil may surround the patient, or alternatively, local RF coils for generating localized magnetic fields could be utilized, such as an RF coil for the head of the patient.

A power supply 17 supplies power to the magnet 12; the static fields generated by the shim coils 13, to improve the static field homogeneity, are controlled via a controllable power supply 20; a number of gradient field amplifiers 24 controls the fields generated by the gradient field coils 14 via three lines 26, one line for each of the x, y, z directions. A pair of transceivers 30, 31 and a pair of associated modulators 32, 33 control the field generated by the RF coil 16. The transceivers 30, 31 also detect and receive electrical MRI signals generated from the magnetic resonance of the MRI constituents and supply those signals to a conventional I/O interface 36 of a controller 40. The controllable power supply 20 and the gradient field amplifiers 24 are also connected to the I/O interface 36 via lines 42, 44, respectively.

The I/O interface 36 includes two pairs of analog-to-digital (A/D) converters (not shown), each of which is connected to receive an input after quadrature detection from a respective one of the transceivers 30, 31.

The controller 40 also includes a processor 50, a random-access memory (RAM) 52, and a read-only memory (ROM) 54, all of which are interconnected via a data bus 56. The processor 50 may process the data (MRI signals) received from the two transceivers 30, 31 on a time-shared basis. Alternatively, separate processors 50 could be provided to process the data from the two transceivers 30, 31 simultaneously. An image display device 58, such as a cathode ray tube (CRT), is also corrected to the controller 40. Additional components, such as a boot and editing terminal 60, a tape drive 62 for storing data relating to images, and a satellite station 64 for performing spectroscopy may also be connected to the controller 40.

During operation, the MRI system 10 generates a uniform static magnetic field via the superconducting magnet 12 and shim coils 13 and selectively generates the gradient and resonating magnetic fields via the coils 14, 16 so as to generate MRI signals corresponding to a selected volume element of the human subject.

As described in U.S. Ser. No. 08/071,582, (now U.S. Pat. No. 5,433,196) entitled "Oxygen-17 NMR Spectroscopy and Imaging in the Human," filed Jun. 2, 1993 and assigned to the same assignee and incorporated herein by reference, the MRI system 10 could be used to generate oxygen-17 images representing the magnitude of blood flow and/or the rate of oxygen consumption in a human.

Figure 2:
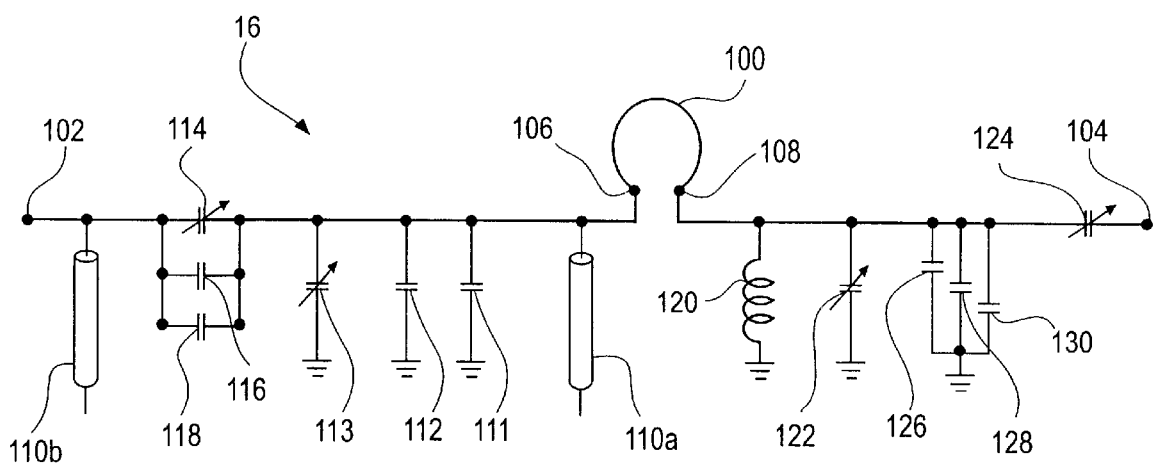
FIG. 2 is a diagram of an embodiment of the RF coil of FIG. 1.
Figure 3:
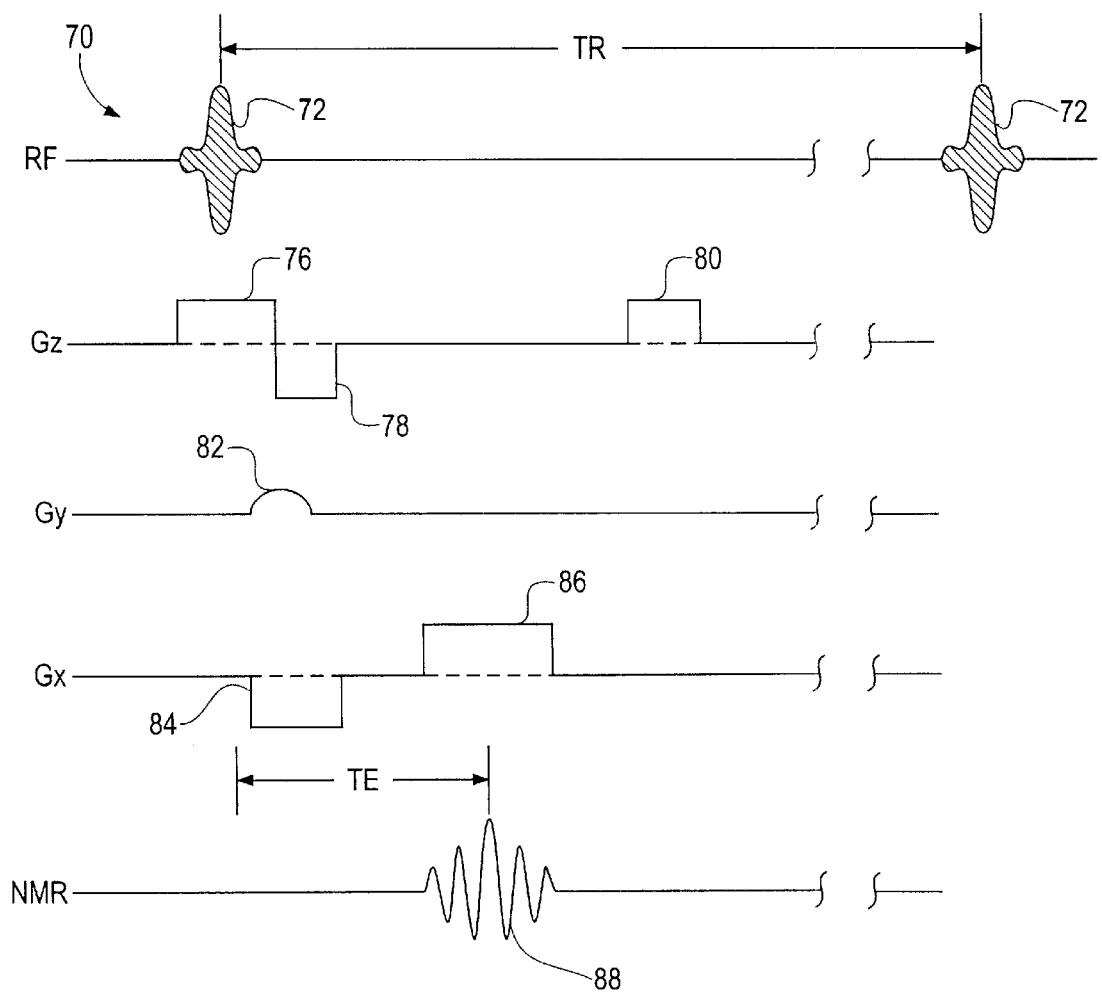
FIG. 3 illustrates a number of electrical signals generated during the operation of the NMR system of FIG. 1, see U.S. Pat. No. 5,433,196.

An RF coil 16 for allowing either simultaneous or consecutive magnetic resonance of MRI constituents in a human body portion via RF excitation at two different frequencies is shown in FIG. 2. The RF coil 16 could be used to provide simultaneous excitation of oxygen-17 and hydrogen-1 constituents in the human body portion in order to, for example, provide accurate superposition of anatomical images produced by hydrogen-1 resonance with images relating to blood flow or oxygen consumption produced by oxygen-17 resonance. Alternatively, the RF coil 16 could be used to provide simultaneous (or consecutive) excitation of xenon-129 and hydrogen-1 constituents in order to, for example, provide accurate superposition of anatomical images produced by hydrogen-1 resonance with images relating to blood flow produced by xenon-129 resonance. The double-resonance coil could also be used to provide simultaneous excitation of xenon-129 and oxygen-17 constituents in order to, for example, provide accurate superposition of images produced by xenon-129 resonance with images produced by oxygen-17 resonance.

As used herein, "simultaneous excitation" means that the RF coil 16 is provided with two different RF frequencies, one RF frequency at each of its two input/output terminals, at the same instant in time. The term "consecutive excitation" means that two RF frequencies provided to the two input/output terminals are alternated in time so that neither RF frequency is provided at the same instant in time as the other RF frequency.

Referring to FIG. 2, the RF coil 16 includes a circular coil element 100 formed of a single loop of copper tubing and is used about the head of the patient. The diameter of the coil element 100 is 11 centimeters and the diameter of the copper tubing is 0.5 cm. The RF coil 16 has a first input/output terminal 102 connected to the left side of the coil element 100 as shown in FIG. 2 and a second input/output terminal 104 connected to the right side of the coil element 100. The coil element 100 has a first end point 106 on its left side at which point the curved portion of the coil element 100 ends and a second end point 108 on its right side at which the curved portion of the coil element 100 ends.

A number of circuit components are connected between the end point 106 of the coil element 100 and the input/output terminal 102 of the coil element 100. Those circuit elements include two coaxial cables 110*a*, 110*b*, a pair of capacitors 111, 112, a variable tuning capacitor 113, a variable impedance-matching capacitor 114, and a pair of capacitors 116, 118 connected in parallel with the impedance-matching capacitor 114. The tuning capacitor 113 is used to tune the circuit to resonate at the RF frequency associated with the input/output 102 terminal. The impedance-matching capacitor 114 is used for conventional impedance-matching purposes. The length of each of the coaxial cables 110*a*, 110*b* (which are open at their lower ends) is substantially one-fourth of the wavelength of the RF signal associated with the input/output terminal 104 so that the cables 110 act as a very low impedance (theoretically zero impedance) to prevent the RF signal provided at the terminal 104 from being detected at the terminal 102. One cable 110 may be used, although two λ/4 coaxial cables 110 are preferred to obtain better isolation.

A number of circuit components are connected between the end point 108 of the coil element 100 and the input/output terminal 104 of the coil element 100. Those circuit elements include a smaller coil element 120, a variable tuning capacitor 122, a variable impedance-matching capacitor 124, and three capacitors 126, 128 and 130 connected to ground. The tuning capacitor 122 is used to fine tune the circuit to resonate at the RF frequency associated with the input/output terminal 104. The impedance-matching capacitor 124 is used for conventional impedance-matching purposes.

The smaller coil element 120 is formed of two circular loops, each of which is three centimeters in diameter, of the same copper tubing of the coil element 100, so that the coil element 120 generates a magnetic field in the same direction as the static field generated by the superconducting magnet 12. The smaller coil element 120 and the main coil element 100 are made as one rigid piece. The inductance of the smaller coil element 120 is 50 ohms, which matches the impedance of a coaxial cable.

The purpose of the smaller coil element 120 is to prevent the RF signal provided at the input/output terminal 102 from being detected at the input/output terminal 104 by acting as a low impedance to the RF signal provided at the input/output terminal 102. The impedance of the smaller coil element 120 (which is primarily inductance) is equal to $2\pi fL$, where f is the frequency of the signal provided to the coil element 120 and L is the inductance of the coil element 120. It can be seen that for lower frequencies, the impedance of the coil element 120 is smaller. Thus, when a relatively low frequency signal is provided to the input/output terminal 102 and a relatively high frequency signal is provided to the terminal 104, the low impedance of the smaller coil element 120 substantially prevents the relatively low frequency signal from being detected at the terminal 104.

A first resonant frequency $f_1$ of the MRI coil 10, as seen at the left input/output terminal 102, is determined by the total capacitance $C_1$ of the components in the left branch of the MRI coil between the point 108 and the terminal 102 and the inductance L of the coil element 100 in accordance with the equation $f_1=1/(2\pi\sqrt{LC_1})$. Similarly, a second resonant frequency $f_2$ of the NMR coil 10, as seen at the right input/output terminal 104, is determined by the total capacitance $C_2$ of the components in the right branch of the MRI coil between the point 106 and the terminal 104 and the inductance L of the coil element 100 in accordance with the equation $f_2=1/(2\pi\sqrt{LC_2})$.

In operation, the left input/output terminal 102 of the RF coil 16 is connected to receive and transmit RP signals at a first MRI frequency, and the right input/output terminal 104 is connected to receive and transmit RF signals at a second MRI frequency. The first MRI frequency should be lower than the second MRI frequency.

The MRI frequency necessary to cause magnetic resonance of an NMR constituent or isotope present in a human body portion is defined in accordance with the well-known Larmor equation set forth below:

$f=H\gamma/2\pi$ where H is the magnitude of the static magnetic field, where $\gamma$ is the gyromagnetic ratio of the isotope to be magnetically resonated, and where f is the MRI frequency necessary to cause nuclear magnetic resonance. The MRI frequency necessary to magnetically resonate oxygen-17 in a static magnetic field of 1.5 Tesla is 8.66 MHz; the MRI frequency necessary to magnetically resonate hydrogen-1 in a static magnetic field of 1.5 Tesla is 63.9 MHz; and the MRI frequency necessary to magnetically resonate xenon-129 in a static magnetic field of 1.5 Tesla is 17.6 MHz.

If the RF coil 16 were used to simultaneously generate images based on dual oxygen-17/hydrogen-1 resonance, the input/output terminal 102 would be connected to a transceiver operable at 8.66 MHz (the Larmor frequency for oxygen-17 at 1.5 Tesla), and the input/output terminal 104 would be connected to a transceiver operable at 63.9 MHz (the Larmor frequency for hydrogen-1 at 1.5 Tesla). The tuning capacitor 113 would be adjusted so that the coil element 100 resonates at 8.66 MHz when an RF signal of that frequency is provided to the input/output terminal 102, and the tuning capacitor 122 would be adjusted so that the coil element 100 resonates at 63.9 MHz when an RF signal of that frequency is provided to the input/output terminal 104. The length of the coaxial cables 110 would be selected to be about one-fourth of the hydrogen-1 wavelength (63.9 MHz)(79 cm for RG/U400 coaxial cable), and the capacitors in the circuit would have the values indicated in the table set forth below.

| MRI COIL FOR SIMULTANEOUS $^{17}O/^1H$ RADIATION | |
|---|---|
| Capacitor | Value |
| 111 | 330 pF |
| 112 | 330 pF |
| 113 | 2–120 pF |
| 114 | 1–18 pF |
| 116 | 10 pF |
| 118 | 10 pF |
| 122 | 1–10 pF |
| 124 | 1–10 pF |
| 126 | 10 pF |
| 128 | 10 pF |
| 130 | 10 pF |

If the RF coil 16 were used to simultaneously generate images based on dual xenon-129/hydrogen-1 resonance, the input/output terminal 102 would be connected to a transceiver operable at 17.6 MHz (the Lartor frequency for xenon-129 at 1.5 Tesla), and the input/output terminal 104 would be connected to a transceiver operable at 63.9 MHz (the Iror frequency for hydrogen-1 at 1.5 Tesla). The tuning capacitor 113 would be adjusted so that the coil element 100 resonates at 17.6 MHz when an RF signal of that frequency is provided to the input/output terminal 102, and the tuning capacitor 122 would be adjusted so that the coil element 100 resonates at 63.9 MHz when an RF signal of that frequency is provided to the input/output terminal 104. The length of the coaxial cables 110 would be selected to be about one-fourth of the hydrogen-1 wavelength (63.9 MHz), and the capacitors in the circuit would have the values indicated in the table set forth below.

| MRI COIL FOR SIMULTANEOUS $^{129}Xe/^1H$ RADIATION | |
|---|---|
| Capacitor | Value |
| 111 | 80 pF |
| 112 | 80 pF |
| 113 | 2–120 pF |
| 114 | 1–18 pF |
| 116 | 2.4 pF |
| 118 | 2.4 pF |
| 122 | 1–10 pF |
| 124 | 1–10 pF |
| 126 | 10 pF |
| 128 | 10 pF |
| 130 | 10 pF |

If the RF coil 16 were used to simultaneously generate images based on dual oxygen-17/xenon-129 resonance, the input/output terminal 102 would be connected to a transceiver operable at 8.66 MHz (the ILrnor frequency for oxygen-17 at 1.5 Tesla), and the input/output terminal 104 would be connected to a transceiver operable at 17.6 MHz (the Larmor frequency for xenon-129 at 1.5 Tesla). The tuning capacitor 113 would be adjusted so that the coil element 100 resonates at 8.66 MHz when an RF signal of that frequency is provided to the input/output terminal 102, and the tuning capacitor 122 would be adjusted so that the coil element 100 resonates at 17.6 MHz when an RF signal of that frequency is provided to the input/output terminal 104. The length of the coaxial cables 110 would be selected to be about one-fourth of the xenon-129 wavelength (17.6 MHz), and the capacitors in the circuit would have the values indicated in the table set forth below.

| MRI COIL FOR SIMULTANEOUS $^{17}$O/$^{129}$Xe RADIATION | |
|---|---|
| Capacitor | Value |
| 111 | 330 pF |
| 112 | 330 pF |
| 113 | 2–120 pF |
| 114 | 1–18 pF |
| 116 | 10 pF |
| 118 | 10 pF |
| 122 | 1–10 pF |
| 124 | 1–10 pF |
| 126 | 131 pF |
| 128 | 131 pF |
| 130 | 131 pF |

Although the hydrogen-1, oxygen-17, and xenon-129 MRI frequencies have been specifically discussed, other MRI frequencies could be utilized in connection with the double-resonant coil of the present invention.

Numerous modifications and alternative embodiments of the invention will be apparent to those skilled in the art in view of the foregoing description. This description is to be construed as illustrative only, and is for the purpose of teaching those skilled in the art the best mode of carrying out the invention. The details of the structure and method may be varied substantially without departing from the spirit of the invention, and the exclusive use of all modifications which come within the scope of the appended claims is reserved.

What is claimed is:

1. A method of measuring a content and a distribution of oxygen-17 isotopes in a body containing first and second nuclei and where oxygen-17 is one of the first and second nuclei, the method comprising steps of:
    applying a first magnetic resonance imaging sequence to the first nuclei of the body;
    irradiating the body with radio waves a decoupling frequency of the second nuclei;
    collecting a nuclear magnetic resonance signal from the first nuclei; and
    forming a nuclear magnetic resonance image of the distribution of the oxygen-17 isotopes in the body.

2. The method as in claim 1 further comprising applying the first magnetic resonance imaging sequence when the body is irradiated with radio waves at a frequency other than an oxygen-17 resonance frequency.

3. The method as in claim 1 further comprising applying the first and second nuclear magnetic resonance signals concurrently.

4. The method as in claim 1 further comprising applying the first and second nuclear magnetic resonance signals simultaneously.

5. The method as in claim 1 wherein the first and second nucleus further comprises oxygen-17 and hydrogen, respectively.

6. The method as in claim 1 wherein the first and second nucleus further comprises hydrogen and oxygen-17, respectively.

7. A method of measuring a content and a distribution of oxygen-17 isotopes in a body, comprising steps of:
    applying a first magnetic resonance imaging sequence to the body when the body is not irradiated with radio waves at an oxygen-17 resonance frequency;
    collecting a first nuclear magnetic resonance signal from the body;
    irradiating the body with radio waves at the oxygen-17 resonance frequency;
    applying a decoupling frequency to the body;
    collecting a second nuclear magnetic resonance signal from the body; and
    calculating a difference in a nuclear magnetic resonance image of the distribution of the oxygen-17 isotopes in the body provided by decoupling.

8. A method of measuring a rate of transfer of a solution within a living body containing a first and second nuclei and wherein one of the first and second nuclei is oxygen-17, such method comprising the steps of:
    administering to the living body a solution containing oxygen-17;
    detecting a rate of distribution of oxygen-17 isotopes in the living body, the step of detecting comprising steps of:
        applying a first magnetic resonance imaging sequence of the first nuclei to the living body;
        irradiating the living body with radio waves at a decoupling frequency of the second nuclei;
        collecting a nuclear magnetic resonance signal of oxygen-17 from the living body; and
        forming an image of a distribution of the oxygen-17 isotopes in the living body based upon the first nuclear magnetic resonance signal.

9. The method as in claim 8 further comprising applying the first and second nuclear magnetic resonance signals concurrently.

10. The method as in claim 8 further comprising applying the first and second nuclear magnetic resonance signals simultaneously.

11. The method as in claim 8 wherein the first and second nucleus further comprises oxygen-17 and hydrogen, respectively.

12. The method as in claim 8 wherein the first and second nucleus further comprises hydrogen and oxygen-17, respectively.

13. A method of measuring oxidative metabolism activity in a living body containing a first and second nuclei and where one of the first and second nuclei is oxygen-17, such method comprising the steps of:
    administering oxygen including oxygen-17 isotopes to the living body; and
    detecting a content of the oxygen isotopes in the living body, the step of detecting comprising steps of:
        applying a magnetic resonance imaging sequence of the first nuclei to the living body;
        irradiating the living body with radio waves at a decoupling frequency of the second nuclei;
        collecting a nuclear magnetic resonance signal of oxyen-17 from the living body; and
        calculating a difference due to decoupling of a distribution of the oxygen isotopes in the living body.

14. The method as in claim 13 further comprising applying the first magnetic imaging sequence when the living body is irradiated with radio waves at a frequency other than the oxygen-17 resonance frequency.

15. The method as in claim 14 wherein the step of applying the first magnetic resonance imaging sequence to the body further comprising irradiating the body with radio waves of a hydrogen-1 resonance frequency.

16. The method as in claim 13 further comprising applying the first and second nuclear magnetic resonance signals concurrently.

17. The method as in claim 13 further comprising applying the first and second nuclear magnetic resonance signals simultaneously.

18. The method as in claim 13 further comprising forming the image by calculating a difference caused by decoupling in a nuclear magnetic resonance signal.

19. The method as in claim 13 wherein the first and second nucleus further comprises oxygen-17 and hydrogen, respectively.

20. The method as in claim 13 wherein the first and second nucleus further comprises hydrogen and oxygen-17, respectively.

* * * * *